(12) United States Patent
Shimizu (10) Patent No.: US 8,399,929 B2
(45) Date of Patent: Mar. 19, 2013

(54) SEMICONDUCTOR INTEGRATED CIRCUIT DEVICE

(75) Inventor: Hiroharu Shimizu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 627 days.

(21) Appl. No.: 12/540,277

(22) Filed: Aug. 12, 2009

(65) Prior Publication Data

US 2010/0059826 A1    Mar. 11, 2010

(30) Foreign Application Priority Data

Sep. 9, 2008  (JP) ................................. 2008-230628

(51) Int. Cl.
*H01L 21/70* (2006.01)
(52) U.S. Cl. ........................ 257/368; 257/401; 327/436
(58) Field of Classification Search .................. 257/368, 257/401, 205; 327/436
See application file for complete search history.

(56) References Cited

U.S. PATENT DOCUMENTS

| | | | |
|---|---|---|---|
| 7,129,767 B2 * | 10/2006 | Brindle et al. | ................ 327/436 |
| 7,226,843 B2 | 6/2007 | Weber et al. | |
| 7,951,722 B2 * | 5/2011 | Ho | ................................. 438/719 |
| 2004/0188736 A1 | 9/2004 | Brindle et al. | |
| 2006/0202231 A1 | 9/2006 | Yamamoto | |

FOREIGN PATENT DOCUMENTS

| | | |
|---|---|---|
| CN | 1685517 A | 10/2005 |
| JP | 2006-66484 A | 3/2006 |
| JP | 2006-253375 A | 9/2006 |

OTHER PUBLICATIONS

Office Action issued Nov. 30, 2012, in Chinese Patent Application No. 200910160028.0.

* cited by examiner

*Primary Examiner* — Mark Prenty
(74) *Attorney, Agent, or Firm* — Miles & Stockbridge P.C.

(57) ABSTRACT

To provide a technique that can maintain uniformity of semiconductor elements and wirings microfabricated, while maintaining the mounting efficiency of circuit cells onto a chip. Respective gate electrodes of an n-channel type MISFET and another n-channel type MISFET forming a NAND circuit cell are coupled to the same node, and simultaneously perform respective on-off operations according to the same input signal. These n-channel type MISFETs are arranged adjacent to each other, and electrically coupled in series. Respective gate electrodes of a p-channel type MISFET and another p-channel type MISFET forming the NAND circuit cell are coupled to the same node, and simultaneously perform respective on-off operations according to the same input signal. These p-channel type MISFETs are arranged adjacent to each other, and electrically coupled in series.

12 Claims, 13 Drawing Sheets

SEMICONDUCTOR INTEGRATED CIRCUIT DEVICE

CROSS-REFERENCE TO RELATED APPLICATIONS

The disclosure of Japanese Patent Application No. 2008-230628 filed on Sep. 9, 2008 including the specification, drawings and abstract is incorporated herein by reference in its entirety.

BACKGROUND OF THE INVENTION

The present invention relates to semiconductor integrated circuit devices, and more particularly, to a technique effectively applied to a semiconductor integrated circuit device having a plurality of metal insulator semiconductor field effect transistors (MISFETs) microfabricated.

Conventionally, the layout design of a semiconductor integrated circuit device includes extending a diffusion layer for power supply in one direction, and arranging a metal oxide semiconductor (MOS) transistor for forming a desired circuit in the layer, all of which are identified as a cell. One example of such a cell layout is disclosed in, for example, Japanese Unexamined Patent Publication No. 2006-253375 (Patent Document 1). The diffusion layer for power supply formed to extend in one direction is also referred to as a "tap".

Japanese Unexamined Patent Publication No. 2006-66484 (Patent Document 2) discloses a semiconductor circuit with an excellent anti-radiation property in which one MOS transistor is coupled in series to one or more other MOS transistors with the same node thereby to prevent the failure of the circuit even when any one of the MOS transistors is broken down.
[Patent Document 1]
Japanese Unexamined Patent Publication No. 2006-253375
[Patent Document 2]
Japanese Unexamined Patent Publication No. 2006-66484

SUMMARY OF THE INVENTION

Figure 13:
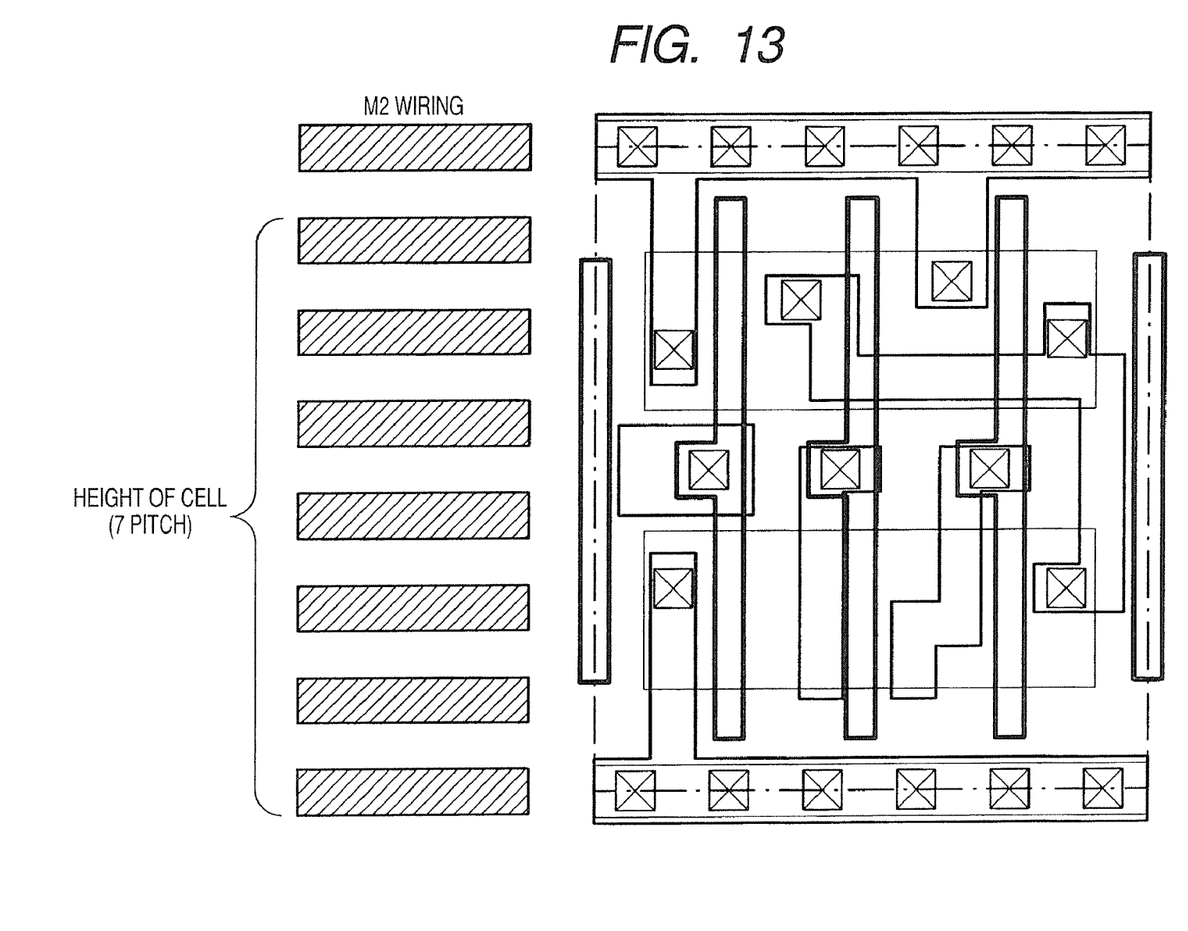
FIG. 13 is a reference diagram for explaining a wiring pitch in the embodiment of the invention.

The height of a cell (that is, the length of a cell in the direction orthogonal to a tap) is determined by the number of wirings which can pass over the cell. Especially, the cell height is determined by consistency between a second layer wiring (M2 wiring) and a third layer wiring (M3 wiring). Specifically, the cell height is determined by the minimum wiring pitch of the second layer wiring (M2 wiring). For example, in the cell shown in FIG. 13, six wirings can pass through between the taps. The cell is identified as one that allows one wiring on one tap in addition to the six wirings, that is, seven wirings to pass therethrough. Such a cell is hereinafter referred to as a 7-pitch cell. The minimum wiring pitch is determined by adding the width of the second layer wiring formed in the minimum dimension of processing to a distance between the wirings formed in the minimum dimension of processing.

Most of the conventional cells are 8-pitch cells or 9-pitch cells. The inventors have tried to achieve a 7-pitch cell, such as that shown in FIG. 13, so as to further reduce the size of the chip. Such an arrangement, however, needs to obtain the same performance while reducing the number of wirings that can pass through the inside of the cell. Thus, the inventors have studied the more appropriate layout of the cell, taking into consideration the extra wirings in the cell, or the arrangement of the MOS transistors.

As a semiconductor element and a wiring have been microfabricated in the semiconductor integrated circuit device, even a small manufacturing error may break uniformity of the semiconductor elements and wirings in shape and property. Thus, careful attention is paid to the design of layout of the arrangement of the semiconductor elements and wirings.

The inventors have found the following problems in designing the layout of a semiconductor integrated circuit device including semiconductor elements and wirings microfabricated.

That is, the inventors have found that in forming the semiconductor elements and wirings microfabricated, when distances between the semiconductor elements and between the wirings are not within respective predetermined distances, the semiconductor integrated circuit device can hardly be formed in a desired shape due to various factors.

For example, a resolution represented in a processable dimension in a photolithography technique is proportional to a wavelength of light from an exposure light source, and is inversely proportional to a numerical aperture of a lens for reduced projection. That is, in order to improve the resolution (to reduce a processing dimension), it is desirable to reduce the wavelength of light from the exposure light source, or to increase the numerical aperture of the lens. However, this leads to a decrease in depth of focus at the same time. Thus, the exposure onto a surface with concavities and convexities larger than the depth of focus cannot provide a desired resolution. That is, the resolution and the depth of focus have a trade-off relationship. When a plurality of gate electrodes are arranged in parallel, the existence of a dense region with a group of gate electrodes and a less dense region with another group of gate electrodes reduces the accuracy of patterning due to the influence of light scattering in exposure for use at a lithography step. In this case, in the less dense region with the gate electrodes, the pattern of the gate electrodes disadvantageously becomes thinner.

The existence of the dense region and less dense region of the gate electrodes causes a stepped portion in forming an interlayer insulating film thereon, which results in variations in thickness of the interlayer insulating film, failing to improve the flatness.

Figure 12:
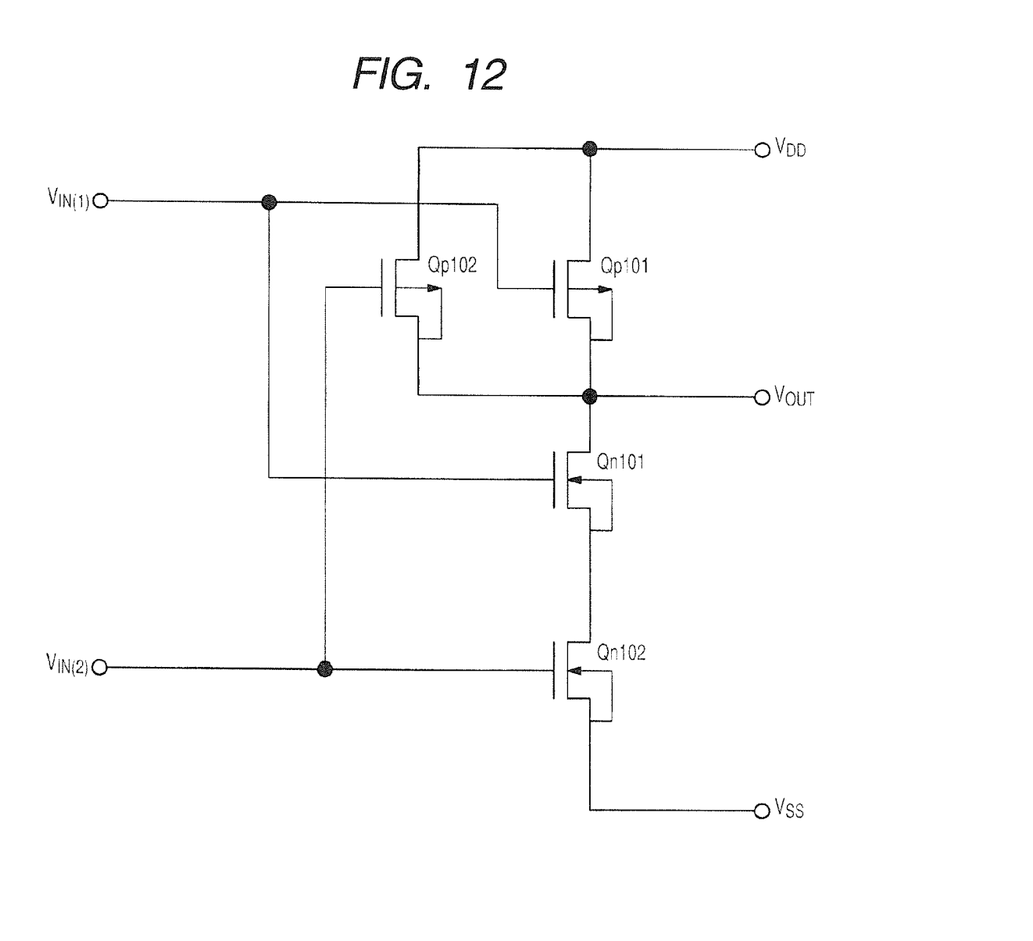
FIG. 12 is a circuit diagram showing the NAND circuit.

In a NAND circuit shown in FIG. 12, two n-channel type MISFETs (metal insulator semiconductor field effect transistor) Qn101 and Qn102, and two p-channel type MISFETs Qp101 and Qp102 in the circuit are required to have the same property so as to keep the operation accuracy of the circuit. In the NAND circuit, the p-channel type MISFET Qp101 and the n-channel type MISFET Qn101 which are coupled to the same node $V_{IN(1)}$ perform the respective on-off operations in cooperation with each other, and the p-channel type MISFET Qp102 and the n-channel type MISFET Qn102 which are coupled to the same other node $V_{IN(2)}$ perform the respective on-off operations in cooperation with each other. When the uniformity in shape of the n-channel type MISFETs Qn101 and Qn102 and the p-channel type MISFETs Qp101 and Qp102 is broken, the uniformity in property of the MISFETs may be broken. Thus, the semiconductor elements and wirings including the n-channel type MISFETs Qn101 and Qn102 and the p-channel type MISFET Qp101 and Qp102 should be laid out so as to be within a predetermined distance from each other. However, the complicated configuration of a circuit cell does not allow the semiconductor elements and wirings forming the circuit cell to be arranged in a limited region.

Figure 7:
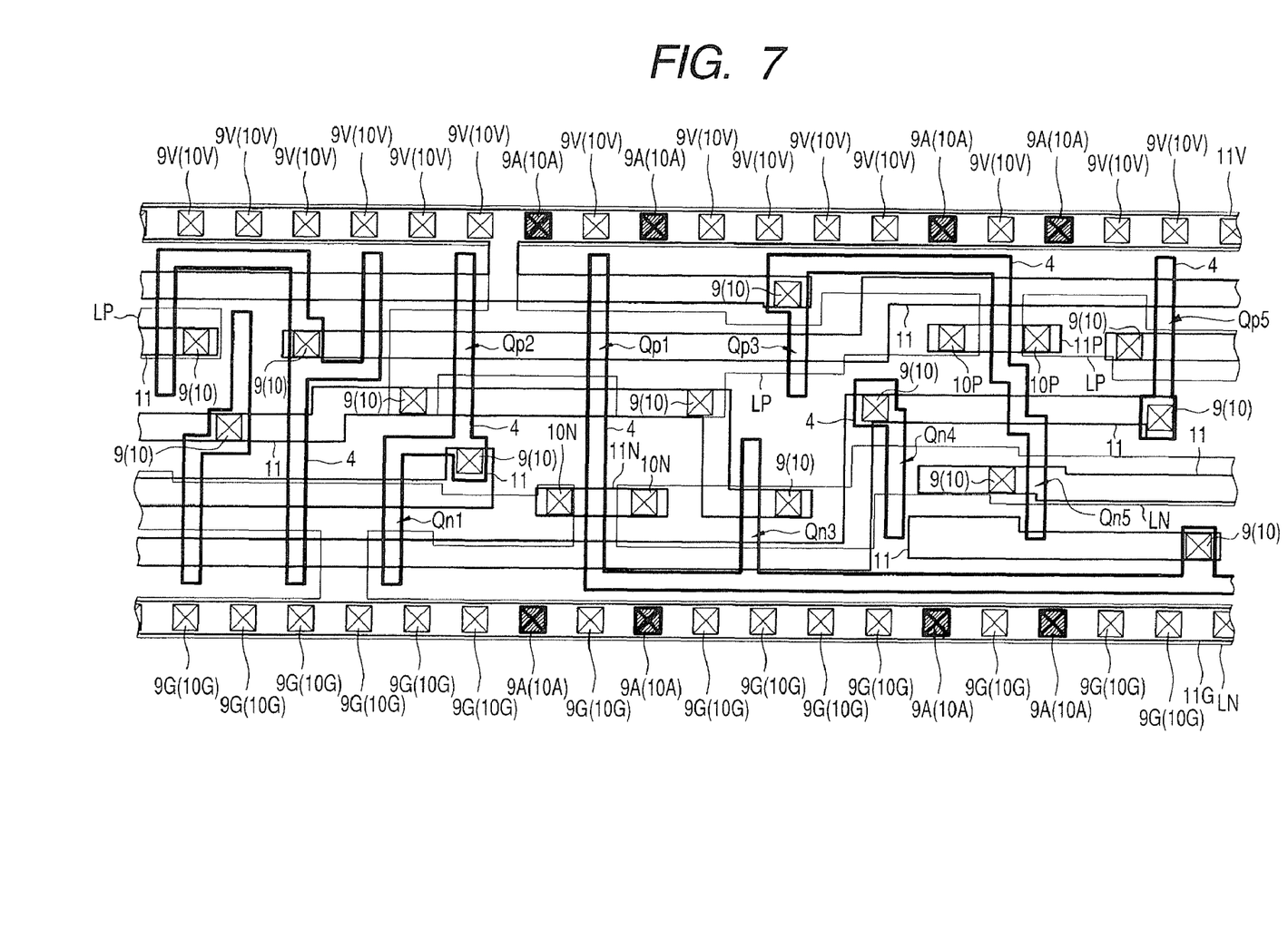
FIG. 7 is a plan view showing main portions of a NAND circuit cell which is compared with the NAND circuit cell included in the semiconductor integrated circuit device in the embodiment of the invention.
Figure 8:
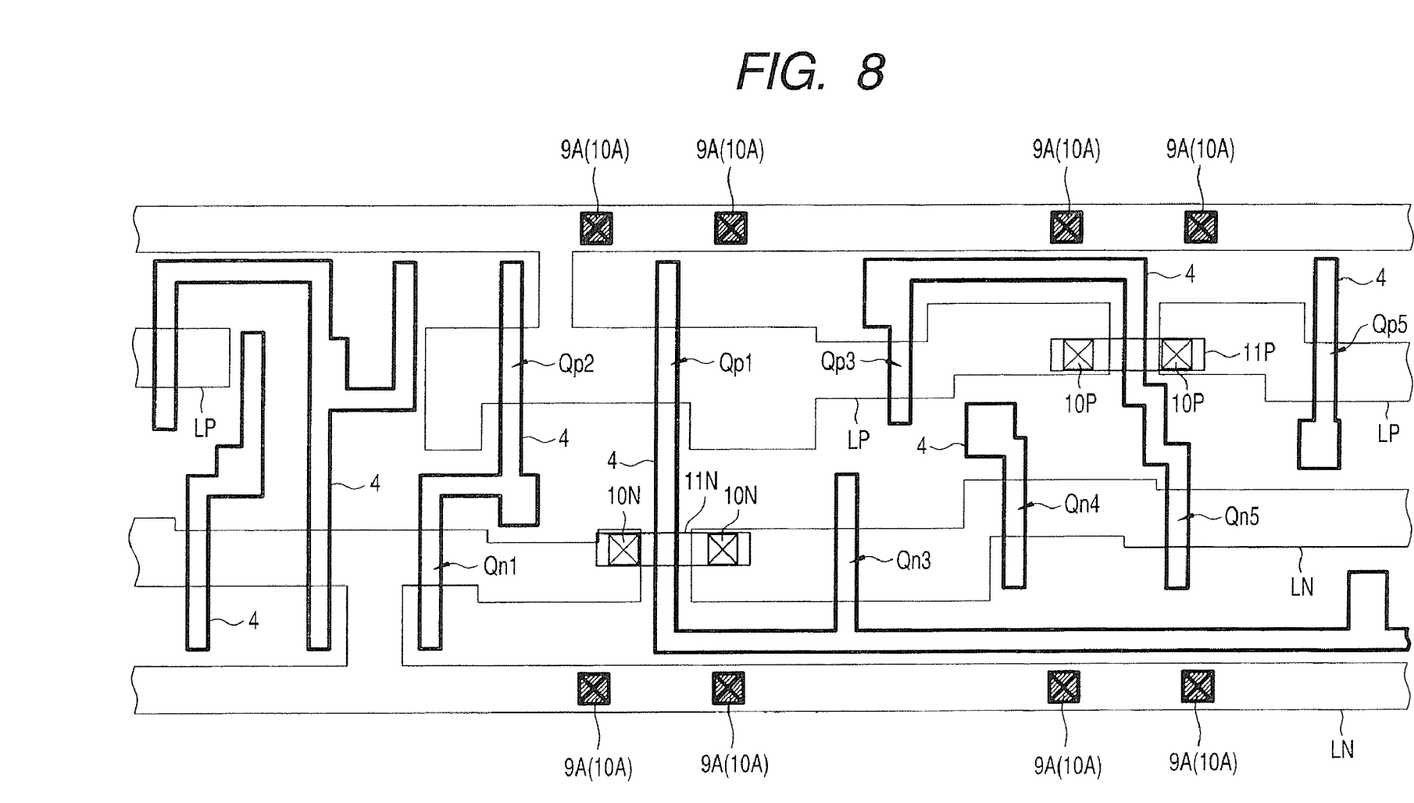
FIG. 8 is another plan view showing the main portions of the NAND circuit cell which is compared with the NAND circuit cell included in the semiconductor integrated circuit device in the embodiment of the invention.
Figure 9:
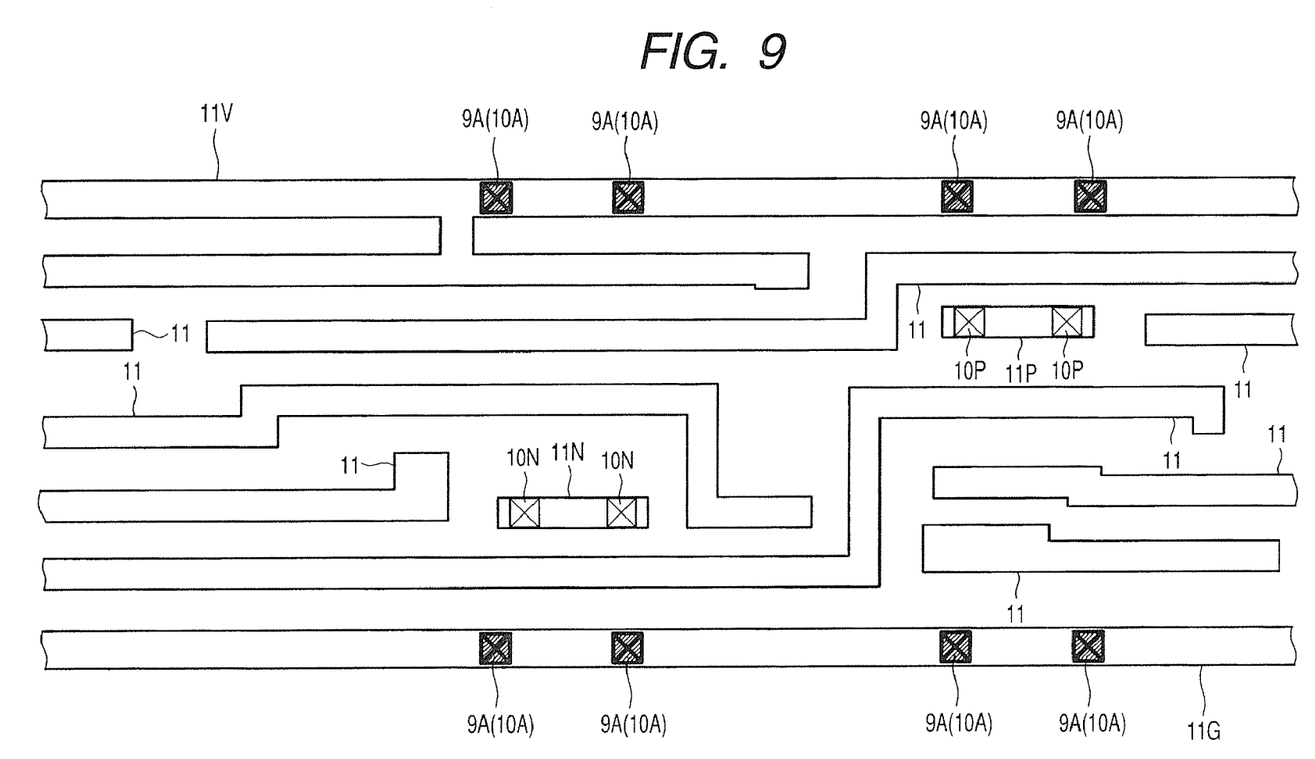
FIG. 9 is a further plan view showing the main portions of the NAND circuit cell which is compared with the NAND circuit cell included in the semiconductor integrated circuit device in the embodiment of the invention.
Figure 10:
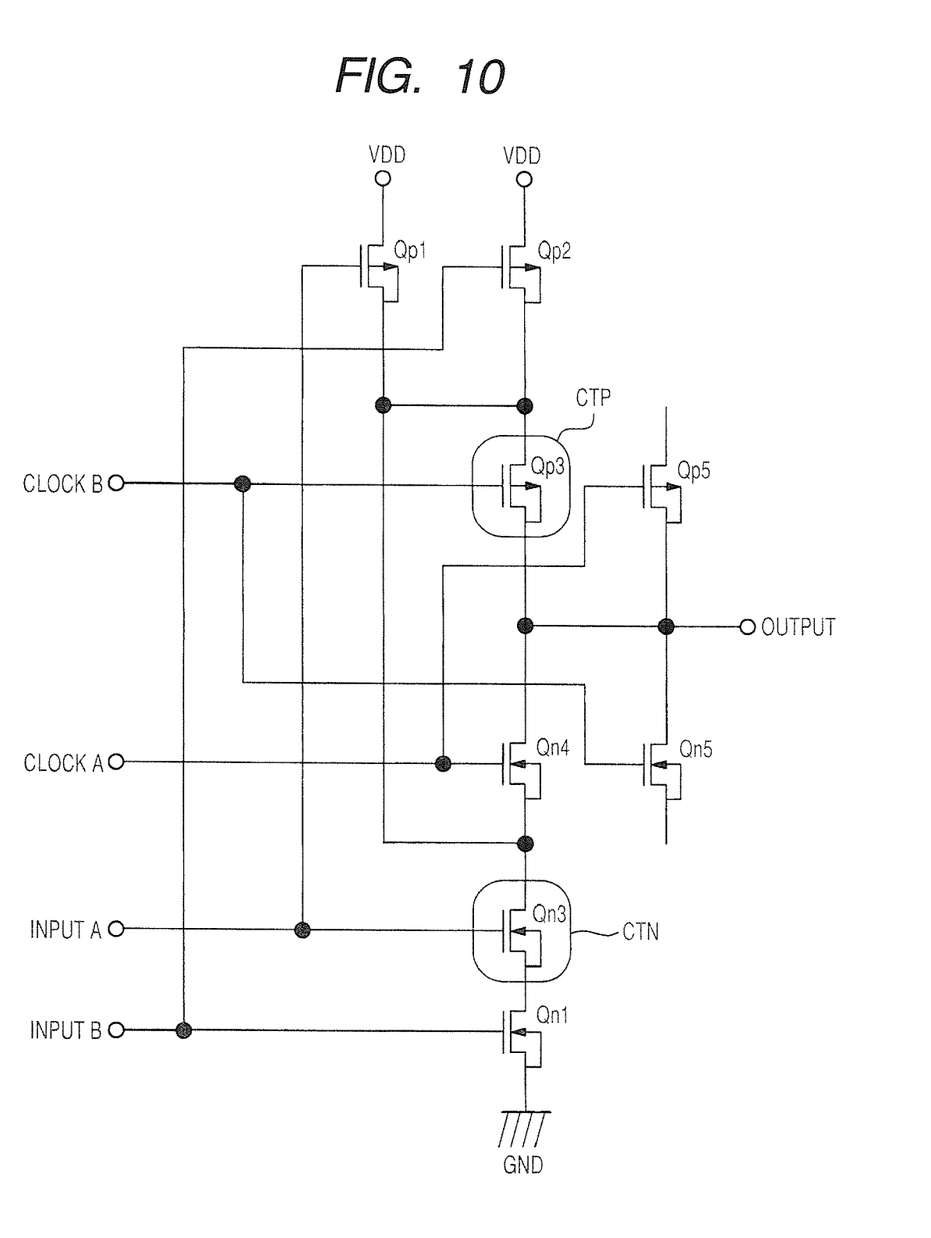
FIG. 10 is a circuit diagram showing the NAND circuit which is compared with the NAND circuit included in the semiconductor integrated circuit device in the embodiment of the invention.

FIGS. 7 to 10 show examples of a 7-pitch cell studied by the inventors. FIGS. 7 to 9 show a plan view corresponding to a NAND circuit cell shown in FIG. 10. FIG. 7 shows components of the MISFET (gate electrode 4 and active regions LN and LP), and first layer wirings 11. FIG. 8 only shows some components of the MISFETs located in the same positions as those in FIG. 7, and wirings 11N and 11P among the first layer wirings 11. FIG. 9 shows only the first layer wirings 11, 11G, and 11V located in the same positions as those shown in FIG. 7.

As shown in FIGS. 7 and 8, a gate electrode of the MISFET Qp1 formed over the p-type active region LP extends above the n-type active region LN to be formed in the same layer as a gate electrode of the MISFET Qn3. The gate electrode of the MISFET Qp1 inherently has only to be coupled to the gate electrode of the MISFET Qn3, and does not need to be arranged across the n-type active region LN.

Since a gap between the gate electrode of the MISFET Qp1 and the gate electrode of the MISFET Qn1 is large, the gate electrode of the MISFET Qp1 is arranged across the n-type active region LN so as not to form a less dense region from the viewpoint of the uniformity described above. Thus, as shown in FIG. 8, the first layer wiring 11N is formed to be coupled to the n-type active region LN cut.

Such a wiring 11N, however, does not allow the wiring for coupling between circuit cells to pass therethrough. Thus, other first layer wirings 11 need to be positioned avoiding the wiring 11N, or alternatively, multilayer wiring using a second layer wiring and the like forms a cell. In other words, the efficiency of layout of the first layer wirings 11 is deteriorated. Thus, a semiconductor chip having a limited size (hereinafter referred to as a simple chip) imposes a restriction on the number of circuit cells mountable thereon, which leads to reduction of mounting efficiency of the circuit cell.

Although the wiring 11N shown in FIG. 8 has been described as one example, the wiring 11P shown in FIG. 8 also has the same kind of problem.

Accordingly, it is an object of the present invention to provide a technique that can maintain uniformity of semiconductor elements and wirings microfabricated, while maintaining the mounting efficiency of circuit cells onto a chip.

It is another object of the invention to provide a technique that can prevent enlargement of the circuit cell.

The above, other objects and novel features of the invention will become apparent from the description of the present specification and the accompanying drawings.

The outline of representative aspects of the invention disclosed in the present application will be briefly described below.

A semiconductor integrated circuit device according to the invention includes a circuit cell including a plurality of MISFETs of the same channel type having gates formed over a main surface of a semiconductor substrate to be coupled to the same node. The MISFETs are coupled adjacent to each other in series, and perform the respective on-off operations in cooperation with input of a signal into the gate.

The effects obtained by the representative aspects of the invention disclosed in the present application will be briefly described below.

The semiconductor integrated circuit according to the invention can maintain uniformity of semiconductor elements and wirings microfabricated, while maintaining the mounting efficiency of circuit cells onto a chip.

Further, the semiconductor integrated circuit device according to the invention can prevent the enlargement of the circuit cell.

DETAILED DESCRIPTION OF THE PREFERRED EMBODIMENTS

The following embodiments will be described by being divided into a plurality of sections or embodiments if necessary for convenience. However, unless otherwise specified, the sections or embodiments are not irrelevant to one another. One of the embodiments has to do with modifications, details and supplementary explanations of some or all of the other.

When reference is made to the number of elements or the like (including the number of pieces, numerical values, quantity, range, etc.) in the following description of the embodiments, the number is not limited to a specific number, and may be greater than, or less than, or equal to the specific number, unless otherwise specified, and unless otherwise definitely limited to the specific number in principle.

It is also needless to say that components (including elements or process steps, etc.) employed in the following description of the embodiments are not always essential, unless otherwise specified, and unless otherwise considered to be definitely essential in principle. The phrase "comprised of A", "made of A" about components, or the like in examples or the like does not exclude an element other than the element A except when described as only the element A.

Similarly, in the description of the shapes, positional relations and the like of the components or the like in the following embodiments, the shapes or positional relations will include ones substantially analogous or similar to their shapes or the like, unless otherwise specified, and unless otherwise considered not to be definitely applicable in principle. This is similarly applied even to the above-described numerical values and range.

In the following description of materials or the like, unless otherwise specified, or unless otherwise considered not to be definitely applicable in principle or from a state, materials as specified are intended to mean main materials, but are not intended to exclude additional elements, additives, adducts, and the like. For example, unless otherwise specified, a silicon member may contain not only pure silicon, but also additive impurities, and binary or ternary alloy (for example, SiGe) or the like including silicon as a main element.

In all drawings for explaining the embodiments of the invention, components having the same functions are designated by the same reference numerals in principle, and a repeated description thereof will be omitted.

In all the drawings used in the embodiments, some areas are partially hatched even in plan views for easy understanding of the drawings.

Now, the preferred embodiments of the invention will be described below in detail based on the accompanying drawings.

The height of a cell described in this embodiment (the length of the cell in the direction orthogonal to a tap) is the same as that described above in FIG. 13. That is, the height of the cell is determined by the number of wirings that can pass through the cell. Especially, the cell height is determined by consistency between a second layer wiring (M2 wiring) and a third layer wiring (M3 wiring). Specifically, the cell height is determined by the minimum wiring pitch of the second layer wiring (M2 wiring). For example, in the cell shown in FIG. 1, six wirings can pass through between the taps. The cell is identified as one that allows one wiring on one tap in addition to the six wirings, that is, seven wirings to pass therethrough. That is, this arrangement is comprised of a 7-pitch cell. The term "minimum wiring pitch" as used herein is one provided by adding the width of the second layer wiring formed in the minimum processing dimension to a distance between the adjacent wirings.

Figure 1:
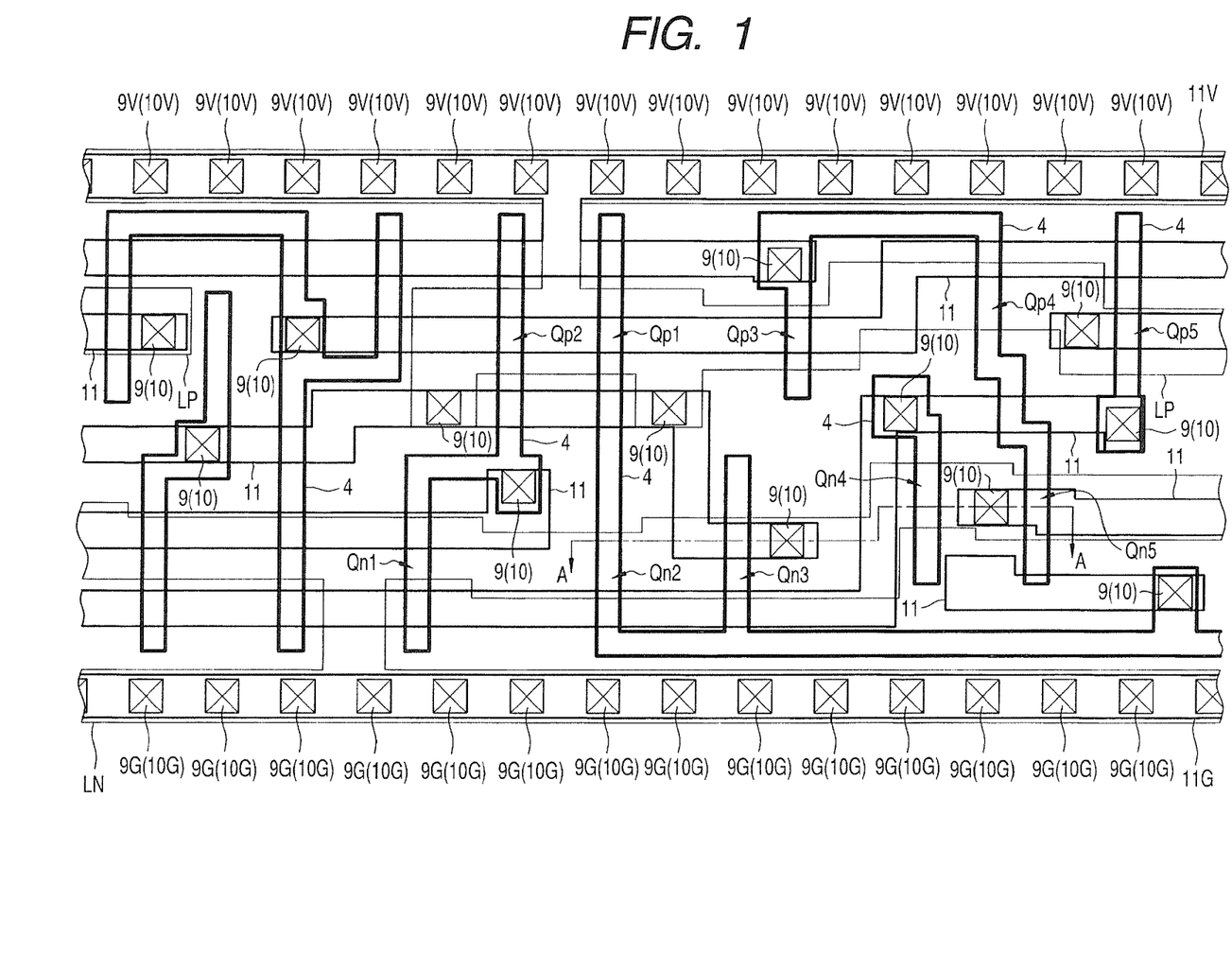
FIG. 1 is a plan view showing main portions of a NAND circuit cell included in a semiconductor integrated circuit device according to one embodiment of the invention.
Figure 2:
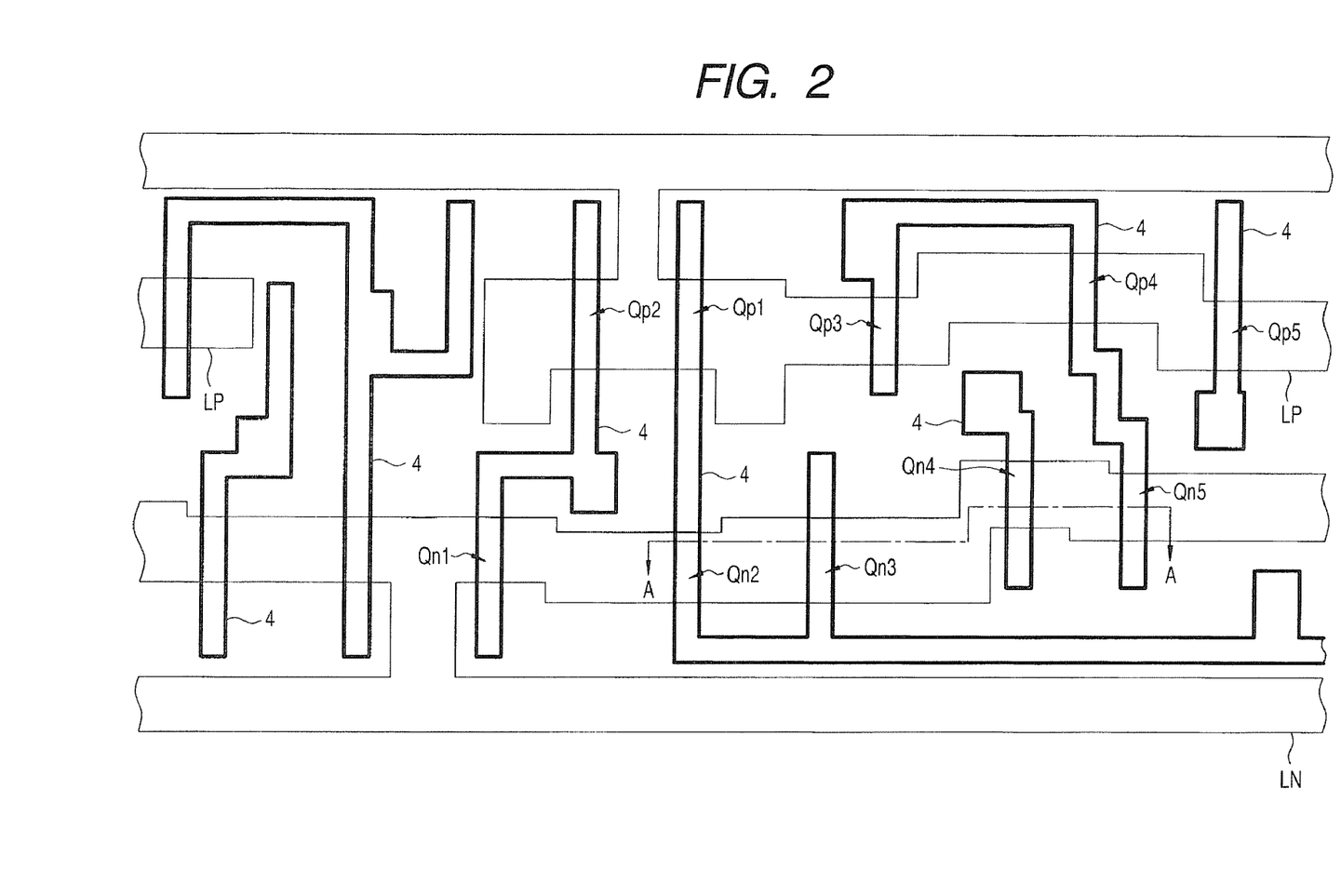
FIG. 2 is another plan view showing the main portions of the NAND circuit cell included in the semiconductor integrated circuit device according to the one embodiment of the invention.
Figure 3:
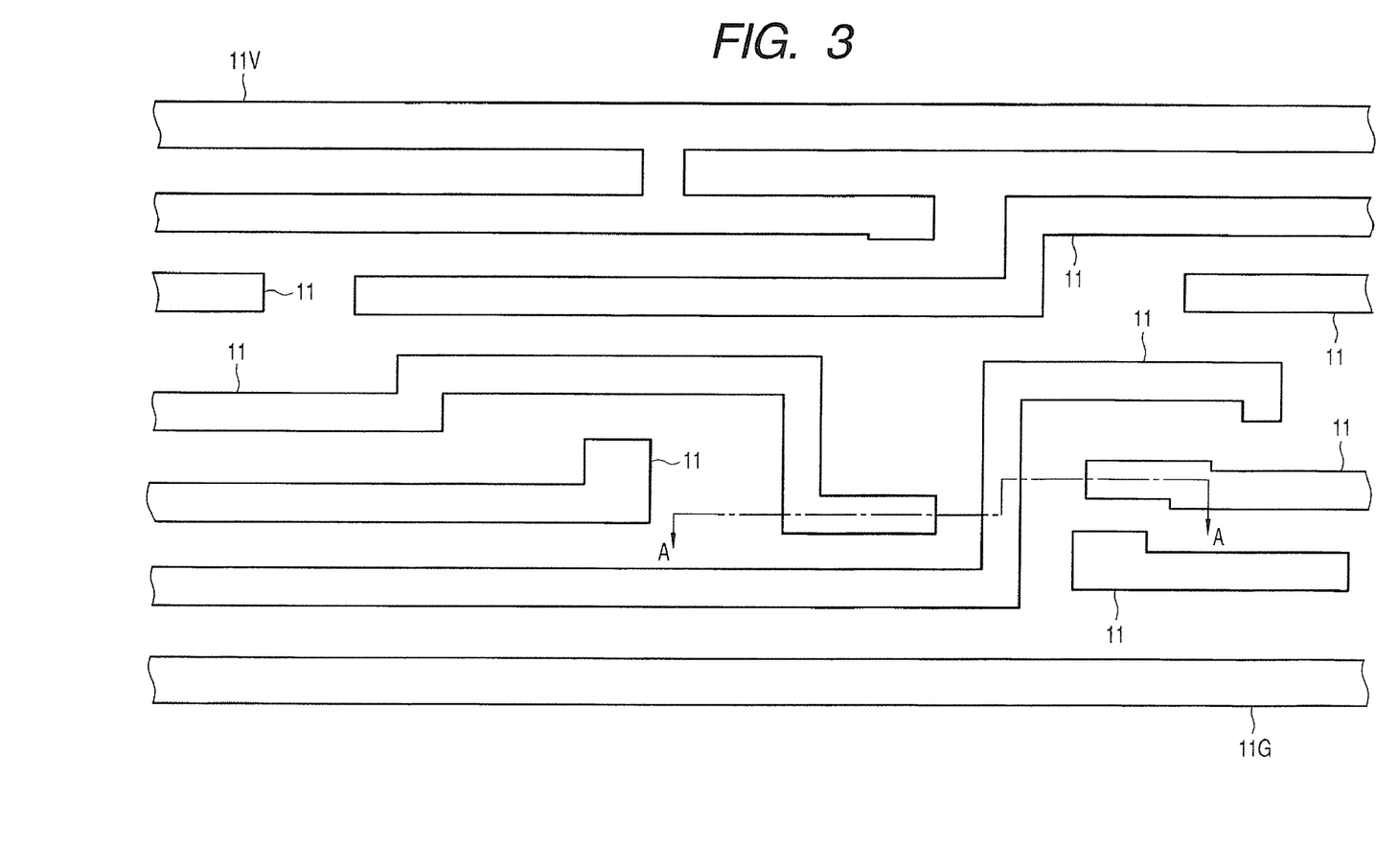
FIG. 3 is a further plan view showing the main portions of the NAND circuit cell included in the semiconductor integrated circuit device according to the embodiment of the invention.
Figure 4:
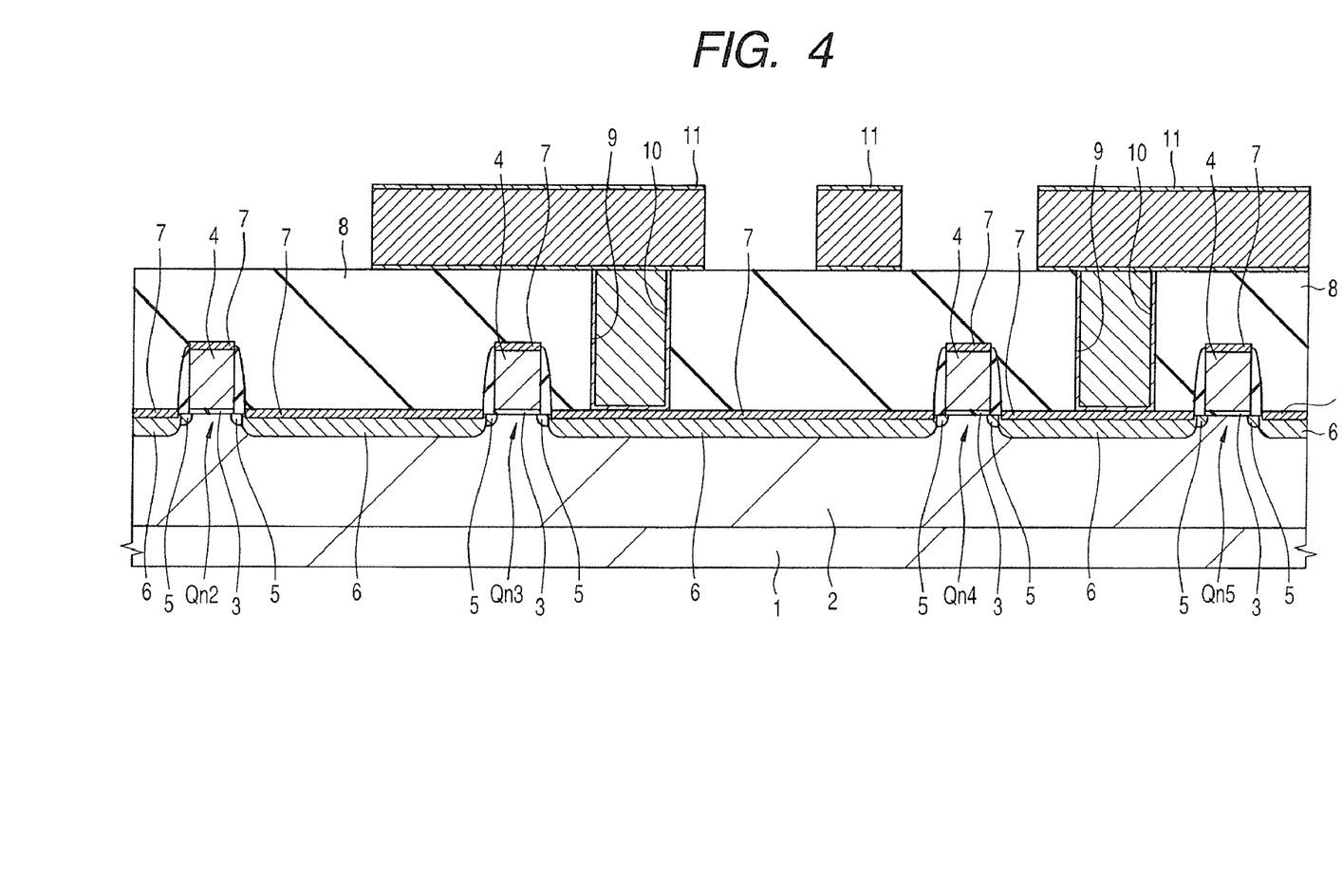
FIG. 4 is a sectional view of the main portions taken along the line A-A of FIG. 1.
Figure 5:
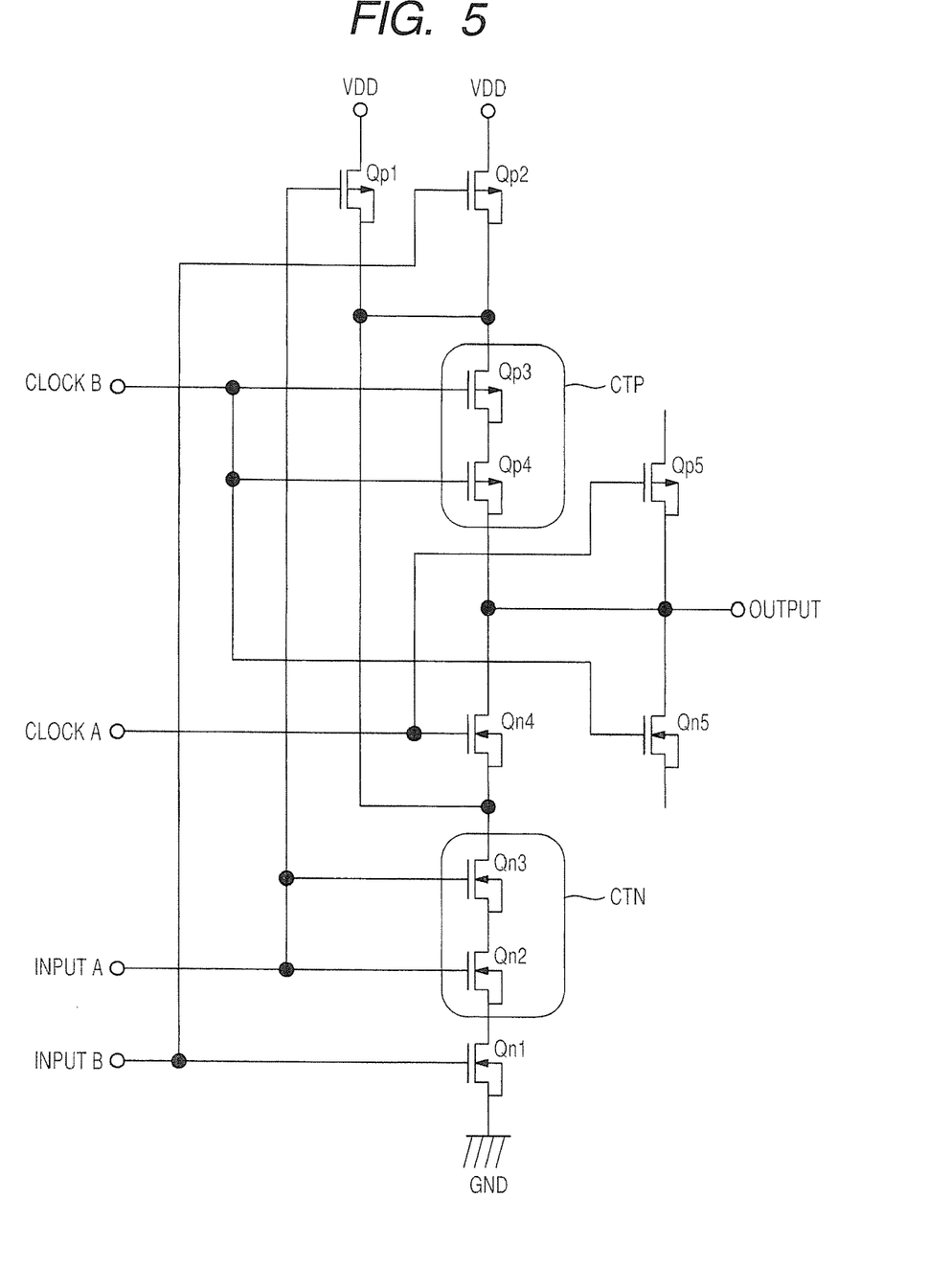
FIG. 5 is a circuit diagram of the NAND circuit included in the semiconductor integrated circuit device in the embodiment of the invention.
Figure 6:
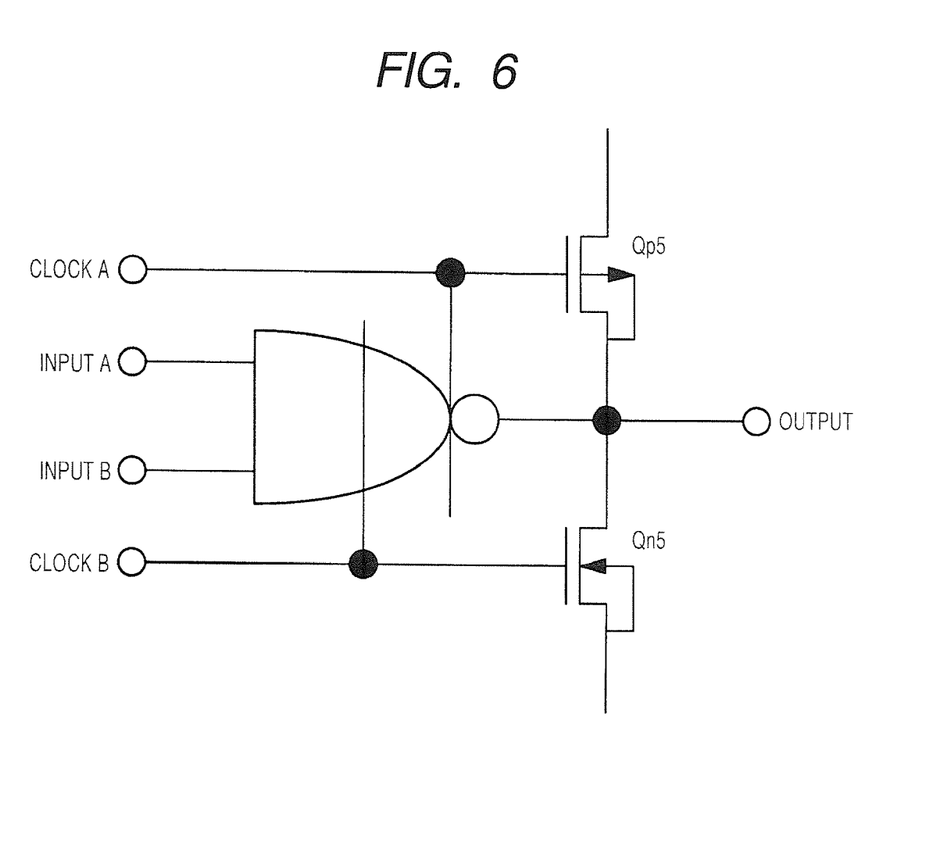
FIG. 6 is a circuit diagram showing the NAND circuit shown in FIG. 5 by use of symbols.

A semiconductor integrated circuit device of this embodiment includes a logic circuit, such as a full adder circuit, a half adder circuit, a flip-flop circuit with a set function, a flip-flop circuit with a reset function, a flip-flop circuit with a scanning function, a 4-input selector circuit, or a 3-input selector circuit. FIGS. 1 to 3 show a plan view of a NAND circuit cell included in the logic circuit. FIG. 1 shows first layer wirings and components of MISFETs (gate electrodes, and active regions defined on a main surface of a semiconductor substrate). FIG. 2 shows only the MISFET components located in the same positions as those in FIG. 1, and FIG. 3 shows only the first layer wirings located in the same positions as those in FIG. 1. FIG. 4 is a sectional view taken along the line A-A in FIG. 1 (while FIGS. 2 and 3 also show the line A-A). FIG. 5 is a circuit diagram of the NAND circuit shown in FIG. 1, and FIG. 6 is a circuit diagram showing the NAND circuit by use of symbols.

A semiconductor substrate 1 having the NAND circuit formed therein is made of a single crystal silicon having a specific resistance, for example, of about 10 Ωcm. A p-type well 2 is formed in an n-channel type MISFET formation region, and an n-type well is formed in a p-channel type MISFET formation region over the semiconductor substrate 1. For example, a shallow trench type isolation region, which is called as a shallow trench isolation (STI) or a shallow groove isolation (SGI), over the main surface of the semiconductor substrate 1 defines an active region LN in the n-channel type MISFET formation region, or an active region LP in the p-channel type MISFET formation region. The STI is a region having an insulating film, such as a silicon oxide film, embedded in a trench formed in the semiconductor substrate 1.

A gate electrode 4 made of, for example, a polycrystalline silicon film, is formed over the main surface of the semiconductor substrate 1 via a gate insulating film 3 made of a thin silicon oxide film or the like. A plurality of gate electrodes 4 of the n-channel type MISFETs are formed in the active region (first active region) LN extending laterally in the figure (in the first direction), and each of the gate electrodes is formed to extend longitudinally in the figure (in the second direction). Likewise, a plurality of gate electrodes 4 of the p-channel type MISFETs are formed in the active region (first active region) LP extending laterally in the figure (in the first direction), and each of the gate electrodes is formed to extend longitudinally in the figure. Among the polycrystalline silicon films forming the gate electrodes 4, the polycrystalline silicon of the n-channel type MISFET has n-type impurities introduced thereinto, and the polycrystalline silicon of the p-channel type MISFET has p-type impurities introduced thereinto.

The active region LN is one having the p-type well 2 formed over the semiconductor substrate. In an area of the active region LN where the n-channel type MISFET is formed, an n$^-$-type semiconductor region 5 and an n$^+$-type semiconductor region 6 are formed on both sides of the gate electrode 4 over the surface of the p-type well 2 to serve as source and drain regions of a lightly doped drain (LDD) structure. In a power supply area of the active region LN for power supply where plugs 10G are arranged, a p$^+$-type semiconductor region is formed on the surface of the p-type well. In operation of the n-channel type MISFET, a potential fed to the active region LN for power supply via the plug 10G is applied to the p-type well 2 of the n-channel type MISFET.

The active region LP is one having the n-type well formed over the semiconductor substrate. In an area of the active region LP where the p-channel type MISFET is formed, a p$^-$-type semiconductor region and a p$^+$-type semiconductor region are formed on both sides of the gate electrode 4 over the surface of the n-type well to serve as source and drain regions of the lightly doped drain (LDD) structure. In a power supply area of the active region LP where plugs 10V are arranged, an n$^+$-type semiconductor region is formed on the surface of the n-type well. In operation of the p-channel type MISFET, a potential fed to the active region LP for power supply via the plug 10V is applied to the n-type well of the p-channel type MISFET.

The concentration of impurities in each of the p$^-$-type semiconductor region and p$^+$-type semiconductor region is higher than that of the p-type well 2. The concentration of impurities in each of the n$^-$-type semiconductor region 5 and n$^+$-type semiconductor region 6 is higher than that of the n-type well.

The surface of the gate electrode 4, the surfaces of the active regions LN (the surface of the n$^+$-type semiconductor region in the region where the n-channel type MISFET is formed, and the surface of the p$^+$-type semiconductor region in the power supply area), and the surfaces of the active regions LP (the surface of the p$^+$-type semiconductor region in the region where the p-channel type MISFET is formed, and the surface of the n$^+$-type semiconductor region in the power supply area) are subjected to a silicide process to form silicide layers 7. The silicide layer 7 is comprised of, for example, cobalt silicide, nickel silicide, molybdenum silicide, or platinum silicide. Such a silicide layer 7 reduces a contact resistance with the plug.

An interlayer insulating film 8 is formed over the main surface of the semiconductor substrate 1 having the gate electrodes 1 formed therein, for example, by depositing a silicon oxide film. The interlayer insulating film 8 has contact holes 9, 9G, and 9V respectively reaching the n+-type semiconductor region 6, the p+-type semiconductor region, and the gate electrodes 4. The contact holes 9G and 9V are arranged in line at equal intervals. A thin laminated film comprised of a titanium film and a titanium nitride film and serving as a barrier conductive film is formed on a side wall and a bottom surface of each of the contact holes 9, 9G, and 9V. The contact holes 9 are filled with the tungsten film thereby to form the plugs 10, 10G, and 10V.

The first layer wirings 11, 11G, and 11V are formed over the interlayer insulating film 8, so that the wiring 11 is coupled to the plug 10, the wiring 11G to the plug 10G, and the wiring 11V to the plug 10V, respectively. These wirings 11, 11G, and 11V each are formed of, for example, aluminum, as a main conductive layer. A reference potential GND is supplied to the wiring 11G, and a power supply potential VDD is supplied to the wiring 11V. The contact holes 9G and 9V (plugs 10G and 10V) are arranged regularly under the wirings 11G and 11V, respectively. That is, the contact holes 9G and 9V (plugs 10G and 10V) are arranged at equal intervals.

As shown in FIG. 1 or 2, the active region LP shown on the uppermost side in the figure to extend laterally is a region to which the power supply potential VDD is supplied via the wirings 11V and the plugs 10V. As shown in FIG. 2, parts of the power supply area for the power supply potential VDD are coupled to a source region of the MISFET Qp1 and a source region of the MISFET Qp2. This coupling is performed via the above-mentioned silicide layer 7. Likewise, the active region LN shown on the lowermost side in the figure to extend laterally is a region to which the reference potential GND is supplied via the wirings 11G and the plugs 10G. As shown in FIG. 2, such a power supply area for the reference potential GND is coupled to the source region of the MISFET Qn2. This coupling is performed via the above-mentioned silicide layer 7. Such a power supply area is often referred to as a "tap".

The NAND circuit cell of this embodiment has a circuit formed only by the first layer (lowermost layer) wirings including the wirings 11, 11G, and 11V. The NAND circuit cell of this embodiment is designed such that the wirings 11, 11G, and 11V arranged in the cell form seven tracks in total. The wiring 11G is used for supplement of the reference potential GND, and the wiring 11V is used for supplement of the power potential VDD. The first layer wirings 11 which can be used for applications, including electrical connection to the source and drain of the MISFET in the cell, form five tracks. The design of all the first layer wirings at the minimum pitch enables the arrangement of six tracks.

In the NAND circuit cell of this embodiment, the n-channel type MISFETs Qn1, Qn2, Qn3, Qn4, and Qn5, and the p-channel type MISFETs Qp1, Qp2, Qp3, Qp4, and Qp5 in the cell are required to have the same properties so as to maintain the operation accuracy of the circuit. For this reason, the n-channel type MISFETs Qn1, Qn2, Qn3, Qn4, and Qn5, and the p-channel type MISFETs Qp1, Qp2, Qp3, Qp4, and Qp5 are also required to have the same shape. All gate electrodes 4 are formed such that the gate lengths thereof and the arrangement pitches thereof are respectively equalized. When the components of the MISFET, such as the gate electrode 4 or the like, have been microfabricated, the uniformity in shape of the group of the MISFETs is maintained, which leads to the remarkable uniformity in property. In particular, for the gate length of about 65 nm or less, and further for the gate length of about 45 nm or less, the property uniformity appears remarkable.

For example, for the gate length of the gate electrode 4 of about 65 nm, the gate electrodes 4 are spaced apart at equal intervals such that the distance between the adjacent gate electrodes 4 is about five to fifteen times as long as the gate length. For the gate length of the gate electrode 4 of about 45 nm, the gate electrodes 4 are spaced apart at equal intervals such that the distance between the adjacent gate electrodes 4 is about three to ten times as long as the gate length. That is, when the gate length of the gate electrode 4 is not more than 65 nm and more than 45 nm, the adjacent gate electrodes 4 are arranged within a range that is five to fifteen times as long as the gate length, and more preferably within a range that is five to ten times as long as the gate length. For the gate length of the gate electrode 4 of 45 nm or less, the adjacent gate electrodes 4 are arranged within a range that is three to ten times as long as the gate length, and more preferably within a range that is three to six times as long as the gate length.

In this embodiment, some of the gate electrodes 4 serving as a component of the n-channel type MISFET or the p-channel type MISFET extends vertically on the paper surface of FIG. 1. The term "adjacent gate electrodes 4" as described above means that the gate electrodes 4 are adjacent to each other laterally on the paper surface shown in FIG. 1.

As shown in FIG. 5, the NAND circuit cell of this embodiment includes four nodes, that is, input terminals A and B, and clock terminals A and B. The result of outputs is determined depending on input signals into these nodes. Among the nodes, respective input signals are input into the inputs A and B, and respective clock signals are input into the clocks A and B.

As shown in FIGS. 1, 2, and 5, the respective gates (gate electrodes 4) of the n-channel type MISFET Qn2 and the n-channel type MISFET Qn3 among the MISFETs forming the NAND circuit cell of this embodiment are electrically coupled to the input A which is the same node to the gates, so that the MISFETs Qn2 and Qn3 simultaneously perform on-off operations according to a signal (third signal) from the input A. The n-channel type MISFET Qn2 and the n-channel type MISFET Qn3 are arranged adjacent to each other to have the same n+-type semiconductor region 6 serving as the respective source or drain, and electrically coupled to each other in series. That is, the operation states of the two n-channel type MISFET Qn2 and the n-channel type MISFET Qn3 are the same as that of one n-channel type MISFET disposed on the circuit. That is, one of the n-channel type MISFET Qn2 and the n-channel type MISFET Qn3 is a dummy MISFET which is unnecessary for the inherent operation of the circuit, and thus can be regarded as a resistance component.

The respective gates (gate electrodes 4) of the p-channel type MISFET Qp3 and the p-channel type MISFET Qp4 among the MISFETs forming the NAND circuit cell of this embodiment are electrically coupled to the clock B which is the same node to the gates, so that the MISFETs Qp3 and Qp4 simultaneously perform the on-off operations according to a signal (third signal) from the clock B. The p-channel type MISFET Qp3 and the p-channel type MISFET Qp4 are arranged adjacent to each other to have the same p+-type semiconductor region serving as the respective source or drain, and electrically coupled to each other in series. That is, the operation states of the two p-channel type MISFET Qp3 and the p-channel type MISFET Qp4 are the same as that of one p-channel type MISFET disposed on the circuit. That is, one of the p-channel type MISFET Qp3 and the p-channel type MISFET Qp4 is a dummy MISFET which is unnecessary for the inherent operation of the circuit, and thus can be regarded as a resistance component.

The above-mentioned n-channel type MISFET Qn2 and n-channel type MISFET Qn3 are defined as a cooperation transistor group CTN, and the above-mentioned p-channel type MISFET Qp3 and p-channel type MISFET Qp4 are defined as a cooperation transistor group CTP. In this embodiment, the input A which is an input node electrically coupled to the cooperation transistor group CTN receives inputs of a SCAN signal, a RESET signal, or a SET signal or the like which works mildly and which hardly interferes with the operation of the circuit due to degradation of a signal rate. When the NAND circuit of this embodiment is contained in a flip-flop circuit with set and reset functions, a signal to be input to the input A is the RESET signal or SET signal in the circuit configuration shown in FIG. 5, whereby the RESET signal becomes True, and the SET signal becomes False. The cooperation transistor group CTN including the two MISFETs coupled to each other in series may have the signal rate reduced. Accordingly, in the NAND circuit of this embodiment, the signal which hardly interferes with the circuit operation due to the degradation of signal rate is input to the cooperation transistor group CTN, which can prevent degradation of the circuit operation.

In the circuit configuration shown in FIG. 5, the n-channel type MISFET may be the p-channel type MISFET, and the p-channel type MISFET may be the n-channel type MISFET. When applied to the flip-flop circuit with the set and reset functions, the SET signal becomes true, and the RESET signal becomes false. Even when the channel types of the MISFETs are reversed in this way, two p-channel type MISFETS located in the positions of the cooperation transistor group CTN shown in FIG. 5 receive inputs of the signal which hardly interferes with the circuit operation due to the degradation of signal rate, which can prevent reduction of the operation of the NAND circuit.

The NAND circuit cell is formed using the above-mentioned cooperation transistor groups CTN and CTP, so that the gate electrodes 4 of the respective MISFETs (n-channel type MISFETs Qn1, Qn2, Qn3, Qn4, and Qn5, and p-channel type MISFETs Qp1, Qp2, Qp3, Qp4, and Qp5) can be arranged at equal predetermined intervals in the NAND circuit cell. Thus, the respective MISFETs can have uniform shape and also uniform property. As a result, the accuracy of the operation of the NAND circuit can be maintained.

In order to avoid enlargement of a NAND circuit cell region, means is proposed for providing the NAND circuit cell in the form of a multilayer wiring structure. The multilayer wiring structure, however, may reduce a region where the wiring for coupling between circuit cells can be disposed. As a result, the region for disposing the wiring for coupling between the circuit cells should be secured in a chip. For this reason, a semiconductor chip having a limited size imposes a restriction on the number of circuit cells mountable thereon, which leads to reduction of mounting efficiency of the circuit cell. On the other hand, since the NAND circuit cell of this embodiment has the circuit formed only by the first layer wirings as mentioned above, the region for disposing the wirings for coupling between the circuit cells does not need to be secured in the chip. Thus, even the chip in the limited size can prevent the disadvantage of decrease in the number of circuit cells mountable thereon, and the reduction of mounting efficiency of the circuit cell. That is, according to this embodiment, the uniformity in shape of the MISFET groups can be maintained, while maintaining the mounting efficiency of the circuit cell onto a chip even when the components of the MISFET, such as the gate electrode 4, are microfabricated. The semiconductor integrated circuit device of this embodiment can prevent the reduction of mounting efficiency of the circuit cell even in the chip having the limited size, which can prevent an increase in manufacturing cost of the semiconductor integrated circuit device.

In the NAND circuit cell of this embodiment, the wirings 11, 11G, and 11V arranged in the cell as described above form seven tracks in total, and thus serve as a cell with a small area comprised of a small number of wiring tracks in design. Taking into consideration the case where each of the cooperation transistor groups CTN and CTP is supposed to be comprised of not two MISFETs, but one MISFET, since the plugs 10 (contact holes 9) and the wirings 11 exist for electrically deriving sources and drains of the respective MISFETs forming the NAND circuit, spaces for forming the respective MISFETs are limited. In such a case, the gate electrodes 4 of the MISFETs cannot be arranged at equal predetermined intervals. Although the number of the MISFETs is decreased, the area of the cell may become large. Such a situation will be described below using FIGS. 7 to 10.

The description based on FIGS. 7 to 10 is the same as that described in the above-mentioned column "Summary of the Invention".

In the layout of the NAND circuit cell shown in FIGS. 7 to 9, the n-channel type MISFET Qn2 and the p-channel type MISFET Qp4 are omitted. The active region LN ($n^+$-type semiconductor region 6) and the active region LP ($p^+$-type semiconductor region) are spaced apart from each other under the gate electrodes 4 in a position where the n-channel type MISFET Qn2 is formed, and in a position where the p-channel type MISFET Qp4 is formed, in the layout shown in FIGS. 1 to 3. The active regions LN and LP spaced apart from each other need to be electrically coupled to each other from the viewpoint of configuration of the NAND circuit shown in FIG. 10. The two active regions LN spaced are electrically coupled to the plugs 10N and the first layer wiring 11N, and the two active regions LP spaced are electrically coupled to the plugs 10P and the first layer wiring 11P. The plugs 10N and 10P and the first layer wirings 11N and 11P are shown in FIGS. 8 and 9.

In order to dispose the above-mentioned plugs 10N, 10P, and the first layer wirings 11N and 11P, the NAND circuit should be enlarged in the direction of extending the wirings 11N and 11P. The wirings 11N and 11P extend in the same direction as that of the wirings 11G and 11V. The layout of the NAND circuit cell shown in FIGS. 7 to 9 is enlarged such that four contact holes 9G and 9V (plugs 10G and 10V) can be added and arranged at equal intervals under the wirings 11G and 11V as compared to the layout of the NAND circuit cell shown in FIGS. 1 to 3. In FIGS. 7 to 9, the contact holes 9G and 9V (plugs 10G and 10V) additionally increased are indicated by the contact hole 9A (plug 10A).

Figure 11:
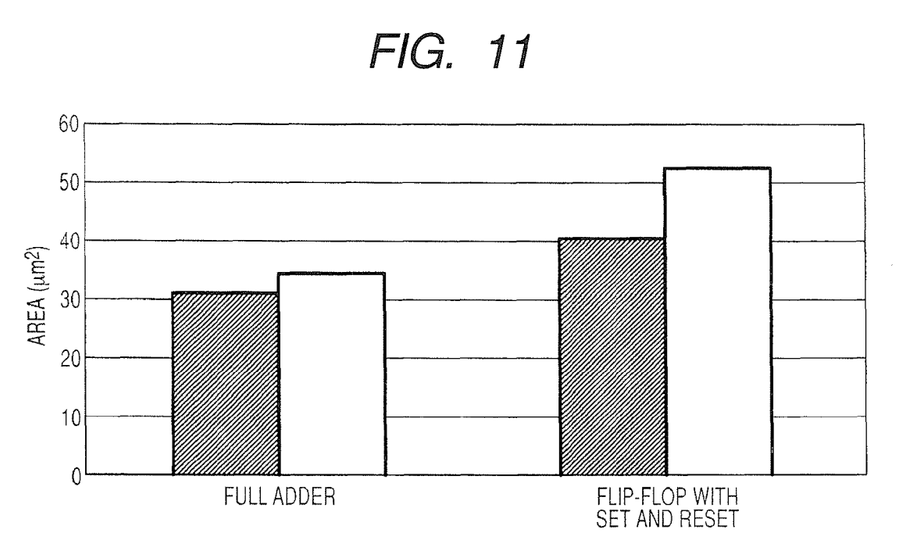
FIG. 11 is a graph showing comparison of circuit areas between the case of use of the layout of the NAND circuit cell shown in FIGS. 1 to 3 and the case of use of the layout of the layout of the NAND circuit cell shown in FIGS. 7 to 9.

FIG. 11 is a graph showing to what degree the circuit area can be decreased in use of the layout of the NAND circuit cell of this embodiment (see FIGS. 1 to 3), as compared to the use of the layout of the NAND circuit cell shown in FIGS. 7 to 9.

As shown in FIG. 11, when the NAND circuit is included in an entire full adder circuit, the layout of the NAND circuit cell of this embodiment can be applied to reduce a circuit area of the entire full adder circuit by about 12%, as compared to the case of application of the layout of the NAND circuit cell shown in FIGS. 7 to 9. When the NAND circuit is included in the flip-flop circuit with set and reset, the layout of the NAND circuit of this embodiment can be applied to reduce a circuit area of the entire flip-flop circuit with set and reset by about 12%, as compared to the case of application of the layout of the NAND circuit cell shown in FIGS. 7 to 9.

That is, according to this embodiment, the NAND circuit cell can be achieved at the minimum area.

The invention made by the inventors has been specifically described above based on the embodiments. The invention is not limited to the embodiments, and various modifications can be made to the invention without departing from the scope of the invention.

In the above-mentioned embodiments, the full adder, the half adder, the flip-flop circuit with set, the flip-flop circuit with reset, the flip-flop circuit with scanning, the 4-input selector circuit, or the 3-input selector circuit has been taken as examples of the logic circuit including the NAND circuit. The logic circuit may be a composite circuit comprised of about a group of twenty to thirty transistors, other than the above-mentioned circuits.

Although in this embodiment, the 7-pitch cell has been described above, the invention is not limited thereto. The invention can also be applied to a cell having 7 pitch or less, such as 6 pitch or 5 pitch in the same way.

Although in this embodiment, the gate electrode 4 made of a polycrystalline silicon film has been described, the invention is not limited thereto, but may be formed of a metal film. Such a metal film may include Ti, TiN, Pt, Al or the like.

Although in this embodiment, the gate insulating film made of a silicon oxide film has been described, the invention is not limited thereto. The gate insulating film may be formed of a film having a dielectric constant higher than that of a silicon nitride film, for example. Such a high dielectric constant film may be, for example, a HfO film, a HfAlO film, a HfSiO film, a ZrO film, a ZrAlO film, a ZrSiO film, a LaO film, a LaSiO film, a TaO film or a TiO film.

The invention can be applied to the layout of MISFETs forming a logic circuit in a semiconductor integrated circuit device having the logic circuit.

What is claimed is:

1. A semiconductor integrated circuit device comprising:
a circuit cell including a plurality of MISFETs of the same channel type having gates formed over a main surface of a semiconductor substrate to be coupled to the same node,
wherein the plurality of MISFETs are each coupled adjacent to each other in series, and perform respective on-off operations in cooperation with input of a signal into the node,
wherein a gate length of each of the MISFETs is equal to or less than 65 nm, and
wherein adjacent gate electrodes of the MISFETs are arranged to be spaced apart from each other within a range that is five to fifteen times as long as the gate length.

2. The semiconductor integrated circuit device according to claim 1, wherein a number of said plurality of MISFETS is two.

3. The semiconductor integrated circuit device according to claim 2, wherein the signal into the node is a signal whose rate is hardly degraded.

4. The semiconductor integrated circuit device according to claim 3, wherein the signal into the node is a SCAN signal, a RESET signal, or a SET signal.

5. A semiconductor integrated circuit device comprising:
a circuit cell including a plurality of MISFETs of the same channel type having gates formed over a main surface of a semiconductor substrate to be coupled to the same node,
wherein the plurality of MISFETs are each coupled adjacent to each other in series, and perform respective on-off operations in cooperation with input of a signal into the node,
wherein a gate length of each of the MISFETs is equal to or less than 45 nm, and
wherein adjacent gate electrodes of the MISFETs are arranged to be spaced apart from each other within a range that is three to ten times as long as the gate length.

6. The semiconductor integrated device according to claim 1, wherein the MISFETs form a full adder circuit, a half adder circuit, a flip-flop circuit with set, a flip-flop circuit with reset, a flip-flop circuit with scanning, a 4-input selector circuit, a 3-input selector circuit, or a composite circuit comprised of twenty to thirty transistors including the MISFETs.

7. The semiconductor integrated circuit device according to claim 1, wherein the circuit cell is formed only of a group of the transistors including the MISFETs, and a lowermost layer wiring over the main surface of the semiconductor substrate.

8. The semiconductor integrated circuit device according to claim 5, wherein a number of said plurality of MISFETs is two.

9. The semiconductor integrated circuit device according to claim 8,
wherein the signal into the node is a signal whose rate is hardly degraded.

10. The semiconductor integrated circuit device according to claim 9,
wherein the signal into the node is a SCAN signal, a RESET signal, or a SET signal.

11. The semiconductor integrated device according to claim 5,
wherein the MISFETs form a full adder circuit, a half adder circuit, a flip-flop circuit with set, a flip-flop circuit with reset, a flip-flop circuit with scanning, a 4-input selector circuit, a 3-input selector circuit, or a composite circuit comprised of twenty to thirty transistors including the MISFETs.

12. The semiconductor integrated circuit device according to claim 5,
wherein the circuit cell is formed only of a group of the transistors including the MISFETs, and a lowermost layer wiring over the main surface of the semiconductor substrate.

* * * * *